United States Patent
Psaute

(10) Patent No.: US 6,194,030 B1
(45) Date of Patent: *Feb. 27, 2001

(54) CHEMICAL VAPOR DEPOSITION VELOCITY CONTROL APPARATUS

(75) Inventor: Jean-Jacques H. Psaute, Colchester, VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/271,515

(22) Filed: Mar. 18, 1999

(51) Int. Cl.$^7$ ................................................. C23C 16/00
(52) U.S. Cl. ........................................ 427/248.1; 118/715
(58) Field of Search ........................... 118/715; 427/248.1

(56) References Cited

U.S. PATENT DOCUMENTS

| | | | |
|---|---|---|---|
| 3,603,284 | 9/1971 | Garnache | 118/48 |
| 4,699,805 | 10/1987 | Seelbach et al. | 437/245 |
| 4,793,283 | * 12/1988 | Sarkozy | 118/725 |
| 4,798,165 | 1/1989 | deBoer et al. | 118/715 |
| 4,892,753 | 1/1990 | Wang et al. | 427/38 |
| 4,986,216 | * 1/1991 | Ohmori | 118/730 |
| 4,992,044 | * 2/1991 | Philipossian | 118/715 |
| 5,000,113 | 3/1991 | Wang et al. | 118/723 |
| 5,121,705 | * 6/1992 | Sugino | 118/729 |
| 5,127,365 | * 7/1992 | Koyama | 118/724 |
| 5,279,670 | * 1/1994 | Watanabe | 118/725 |
| 5,354,715 | 10/1994 | Wang et al. | 437/238 |
| 5,362,526 | 11/1994 | Wang et al. | 427/573 |
| 5,447,568 | 9/1995 | Hayakawa et al. | 118/715 |
| 5,484,484 | * 1/1996 | Yamaga | 118/715 |
| 5,571,333 | * 11/1996 | Kanaga | 118/715 |
| 5,653,810 | 8/1997 | Kataoka et al. | 118/723 E |

FOREIGN PATENT DOCUMENTS

| | | | |
|---|---|---|---|
| 58206119 | 5/1982 | (JP) . | |
| 60-202937 | * 10/1985 | (JP) . | |
| 1-309315 | * 12/1989 | (JP) | 118/724 |
| 2-58825 | * 2/1990 | (JP) . | |
| 3-211823 | * 9/1991 | (JP) | 118/715 |
| 6224129 | 8/1994 | (JP) . | |

* cited by examiner

Primary Examiner—Richard Bueker
(74) Attorney, Agent, or Firm—Downs Rachlin & Martin PLLC

(57) ABSTRACT

An apparatus (10) for depositing a thin film on each surface (116) of a plurality of substrates, such as wafers (114). The apparatus comprises a liner tube (50) having a first end (54), a second end (56) and an interior (68) capable of accommodating the substrates between the first and second ends. The apparatus includes a gas supply system (140) for providing a reactive gas to the liner tube interior at or near its first end, and a gas exhaust system (160) to exhaust the gas emerging from the second end. A gas flow restrictor (120) is arranged at the second end and is designed so as to restrict the flow of the gas at the second end such that the gas flow velocity at the first end is substantially the same as the gas flow velocity at the second end. This uniformizes the gas flow between the substrates within the liner tube, which results in the thin film being deposited more uniformly on each wafer surface.

28 Claims, 2 Drawing Sheets

CHEMICAL VAPOR DEPOSITION VELOCITY CONTROL APPARATUS

FIELD OF THE INVENTION

The present invention relates to methods and apparatus for low pressure chemical vapor deposition (LPCVD) of thin films onto a substrate, and more particularly to a method and apparatus for improving the thin film uniformity by controlling the velocity of gas within the LPCVD apparatus.

BACKGROUND OF THE INVENTION

LPCVD is a technique for forming thin film layers on substrates. In particular, LPCVD is used to form metal films (e.g., for wiring), semiconductor films (e.g., for doping to form active areas) and insulating films (e.g., for insulating the metal wires) on silicon wafers in fabricating semiconductor devices such as integrated circuits.

Briefly, a typical prior art LPCVD apparatus includes a heated chamber within which is held one or more wafers on which a thin film is to be deposited. A gas inflow system at one end of the chamber inflows a reactive gas into the chamber. The chamber is kept at low pressure so that the reactive gas flows through the chamber and flows over the surfaces of the one or more wafers. The combination of temperature, pressure and the particular type of reactive gas results in a film being deposited on the surface of each of the one or more wafers. A gas exhaust system removes the reactive gas, as well as other gaseous compounds formed by the reactive process.

In semiconductor manufacturing, it is highly advantageous to deposit thin films on a plurality of wafers in one deposition process because it increases throughput and allows for better process control. However, a major disadvantage with this approach using prior art LPCVD apparatus is that the uniformity of the films deposited on each wafer can vary over each wafer and amongst the wafers due to uneven gas flow velocity between the wafers. This is because the deposition rate of the film is related to the uniformity of the gas flow velocity between the wafers. In particular, it has been observed that the wafers closest the gas input end typically have non-uniform thin films. This is problematic, since in the art of semiconductor manufacturing, it is known that uniform films are an important aspect of successfully fabricating semiconductor devices.

Most prior art apparatus are capable of altering the gas flow within the chamber only by altering the amount of exhaust using a vacuum pump, or by altering the gas inflow at the gas inflow end of the chamber. For example, U.S. Pat. No. 4,699,805 to Seelbach et al. discloses an LPCVD process and apparatus for enhancing the gas flow within the chamber by providing a U-shaped gas injection tube. The tube is coupled to a vacuum pump which controls the pressure within the chamber. Another example of external chamber pressure control is described in U.S. Pat. No. 5,653,810 to Kataoka et al., which discloses an apparatus and process for forming a metal film in a CVD apparatus, wherein the pressure inside the liner tube is controlled by a control valve in an external exhaust unit.

Other prior art CVD apparatus are capable of altering the flow of gas within the chamber, but are limited to forming a film on a single wafer. For example, U.S. Pat. No. 5,362,526 to Wang et al. discloses a high-pressure single wafer CVD apparatus having a uniform radial-pumping gas apparatus which enables uniform reactant gas flow across the wafer. The gas apparatus includes a gas distributor plate in close proximity to the wafer. While the distributor plate is directed to the general idea of directing the gas flow in relation to the wafer, the direction of the flow radial. In addition, the distributor plate is designed for use in a high-pressure, single wafer CVD apparatus, and does not appear to be applicable to a low-pressure, multi-wafer CVD apparatus. Similarly, U.S. Pat. No. 4,798,165 to deBoer discloses an improved technique for providing deposition materials to a growth surface by passing a reactive gas through a plate having a plurality of apertures, the plate being arranged in close proximity to the surface on which deposition is to be carried out. However, the aperture plate is limited to affecting the air flow around in the vicinity of the single surface. Moreover, the plate is required to be substantially the size of the single surface.

SUMMARY OF THE INVENTION

The present invention relates to methods and apparatus for LPCVD of thin films onto a substrate, and more particularly to a method and apparatus for improving the thin film uniformity by controlling the velocity of gas within the LPCVD apparatus.

A first aspect of the invention is an apparatus for depositing a thin film on each surface of a plurality of substrates. The apparatus comprises a liner tube having a first end, a second end and an interior capable of accommodating the substrates between the first and second ends. A gas supply system provides a reactive gas to the interior at or near the first end. A gas exhaust system with an exhaust cross-sectional area, exhausts the gas emerging from the second end. A gas flow restrictor is arranged at the second end and is designed so as to restrict the flow of the gas at the second end.

A second aspect of the invention is a gas flow restrictor, suitable for use in the apparatus described above, in the form of a restrictor plate having apertures therein. The restrictor plate apertures preferably have a collective area substantially the same as the exhaust cross-sectional area. Also, the plate is preferably curved and fits over the second end of the liner tube as a removable cap. The plate can also be integral with the liner tube.

A third aspect of the invention is a method of depositing a thin film on the surface of each of a plurality of substrates in a LPCVD apparatus having a liner tube with a first end, a second end and an interior capable of accommodating the plurality of substrates between the first and second ends, and a gas exhaust cross-section. The method comprises the steps of first, flowing a reactive gas into the liner tube through the first end at a first velocity, and then restricting the flow of the gas only at the second end so as to make the flow of gas at the second end have a second velocity that is substantially the same as the first velocity.

A sixth aspect of the invention is a method as described above, wherein the step of restricting the flow of gas includes the step of adding a gas flow restrictor, as described above, at the second end.

DETAILED DESCRIPTION OF THE INVENTION

The present invention relates to methods and apparatus for LPCVD of thin films onto a substrate, and more particularly to a method and apparatus for improving the thin film uniformity by controlling the velocity of gas within the LPCVD chamber.

Figure 1:
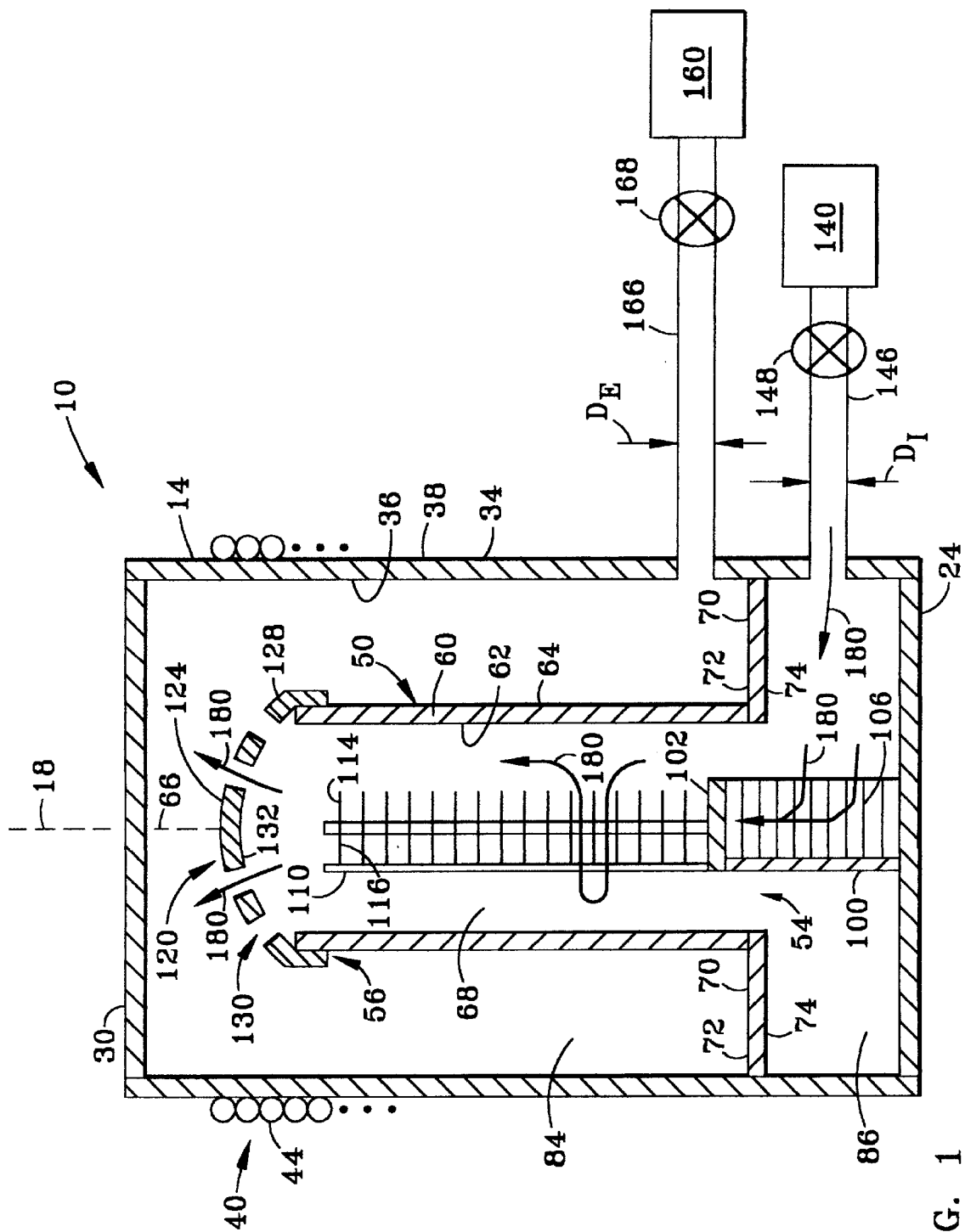
FIG. 1 is a schematic cross-sectional diagram of the LPCVD apparatus of the present invention.

With reference to FIG. 1, apparatus 10 of the present invention comprises an elongate cylindrical chamber 14 with a longitudinal axis 18 and having a first end 24, a removable (or openable) second end 30, and a wall 34 having an inner surface 36 and an outer surface 38. Immediately adjacent outer surface 38 is a heating assembly 40 comprising heating elements 44.

Arranged within chamber 14 is an elongate cylindrical inner liner tube 50 having first and second open ends 54 and 56, respectively. Liner tube 50 further includes a wall 60 with an inner surface 62, an outer surface 64, a longitudinal axis 66, and an interior 68. Interior 68 is sufficiently large to accommodate a plurality of substrates, as discussed further below. Liner tube 50 can be inserted and removed from chamber 14 through removable/openable second end 30 and is arranged to be substantially concentric with chamber 14 (i.e., liner tube axis 66 is substantially co-axial with chamber axis 18).

Further, liner tube 50 is arranged such that liner tube first end 54 is near chamber first end 24 and liner tube second end 56 is near chamber second end 30. Liner tube 50 is preferably made of quartz and is designed to prevent the deposition of material produced during the thin film deposition process on inner surface 36 of chamber 14, thereby increasing the life of the chamber. Liner tube 50 can also be replaced when switching from one deposition mode to another to prevent contamination of one deposition process by the residue from a previous deposition process. Liner tube 50, in one embodiment of the present invention, constitutes a CVD furnace. Also, chamber 14 and liner tube 50 are shown vertically arranged, but they can be horizontally arranged as well.

Wall 60 of liner tube 50 is connected at first end 54 to inner surface 36 of chamber wall 34 near first end 24 by a connector wall 70 having an inner surface 72 and an outer surface 74, thereby forming first and second cavities 84 and 86, respectively, within apparatus 10. First cavity 84 is defined by outer surface 64 of liner tube wall 60, inner surface 36 of chamber wall 34 and inner surface 72 of connector wall 70. Second cavity 86 is defined by first end 24, inner surface 36 of chamber wall 34 and outer surface 74 of connector wall 70.

Within second cavity 86 is a pedestal 100 resting on first end 24 of chamber 14 and which may partially extend into interior 68 of liner tube 50, as shown. Pedestal 100 includes an upper surface 102 and a plurality of heating elements 106 below the upper surface, whose function is described further below. Upper surface 102 supports a wafer holder (i.e., a wafer boat) 110 which extends from pedestal 100 axially into interior 68 of liner tube 100. Wafer holder 110 is designed to hold a plurality of substrates, here illustrated as silicon wafers 114 each with a surface 116 onto which a film is to be deposited. Wafer holder 110 is designed to hold wafers 114 substantially perpendicular to liner tube axis 66.

With continuing reference to FIG. 1, apparatus 10 further includes a gas flow restrictor 120 removably attached to second end 56 of liner tube 50. Restrictor 120 is in the form of a plate 124 having an outer edge 128, a plurality of apertures 130 and an underside 132. Restrictor 120 is discussed in greater detail below.

With continuing reference to FIG. 1, apparatus 10 further includes a gas supply apparatus 140 adjacent chamber first end 24, for supplying gas to chamber 14. Gas supply system 140 may include, for example, one or more pressurized gas cylinders (not shown). Gas supply system 140 includes an inlet pipe 146 with a diameter $D_I$ and which is in pneumatic communication with second cavity 86 through wall 34 near first end 24. Inlet pipe 146 may be, for example, ¼" (0.635 cm) SST tubing. Gas supply system 140 is capable of providing reactive gases, such as TEOS, $SiH_4$ (silane), $O_2$, $N_2$, $A_s$, $H_3$, and $BCl_3$. Inlet pipe 146 includes a flow controller 148 for controlling the flow of gas from system 140 to chamber 86.

Apparatus 10 also includes a gas exhaust system 160 preferably adjacent first end 24 of chamber 14, for exhausting gas from the chamber. Gas exhaust system 160 may include, for example, one or more vacuum pumps (not shown), and also includes an outlet pipe 166 in pneumatic communication with first cavity 84 through chamber wall 34. Outlet pipe 166 has an exhaust cross-sectional area $A_E$ and a diameter $D_E$ that is typically significantly larger than diameter $D_I$ of inlet pipe 146, e.g., $D_E/D_I > 16$. For an exhaust pipe 166 having a circular cross-section, exhaust cross-sectional area $A_E$ is given by $A_E = \pi(D_E/2)^2$. Exhaust pipe 166 includes a flow controller 168 for controlling the flow of gas from chamber 84 to exhaust system 160.

With continuing reference to FIG. 1, the operation of apparatus 10 is now described. First, removable/openable second end 30 is opened or removed from chamber 14 and silicon wafers 114 are placed within wafer holder 110. End 30 is closed or replaced and chamber 14 is evacuated by opening valve 168 and activating exhaust system 160. Heating elements 44 of heating assembly 40 are then activated. A reactive gas, such as one mentioned above and flow of which is represented by an arrow 180, is then introduced into second cavity 86 from gas supply 140. The gas then flows through heating elements 106 in pedestal 100, thereby heating the gas. The gas then flows through first end 54 of liner tube 50 and into liner tube interior 68, whereupon the heated gas is further heated due to heating elements 44. The gas then flows in between wafers 114, which are also heated by virtue of the activation of heating elements 44. Gas supply system 140 and gas exhaust system 160 are operated so that the pressure within liner tube 50 due to the gas can range from 100 mT to 100 T.

As the gas contacts wafer surfaces 116, a reaction occurs, resulting in a film being deposited on the surfaces. For example, Si atoms from silane gas which disassociates in liner tube 50 may epitaxially deposited on surfaces 116 as a crystalline silicon layer. After the gas passes through wafers 114, it continues toward second end 56 of liner tube 50 and encounters restrictor 120. Thus, first end 54 is the gas inflow end and second end 56 is the gas outflow end of liner tube 50.

Figure 3:
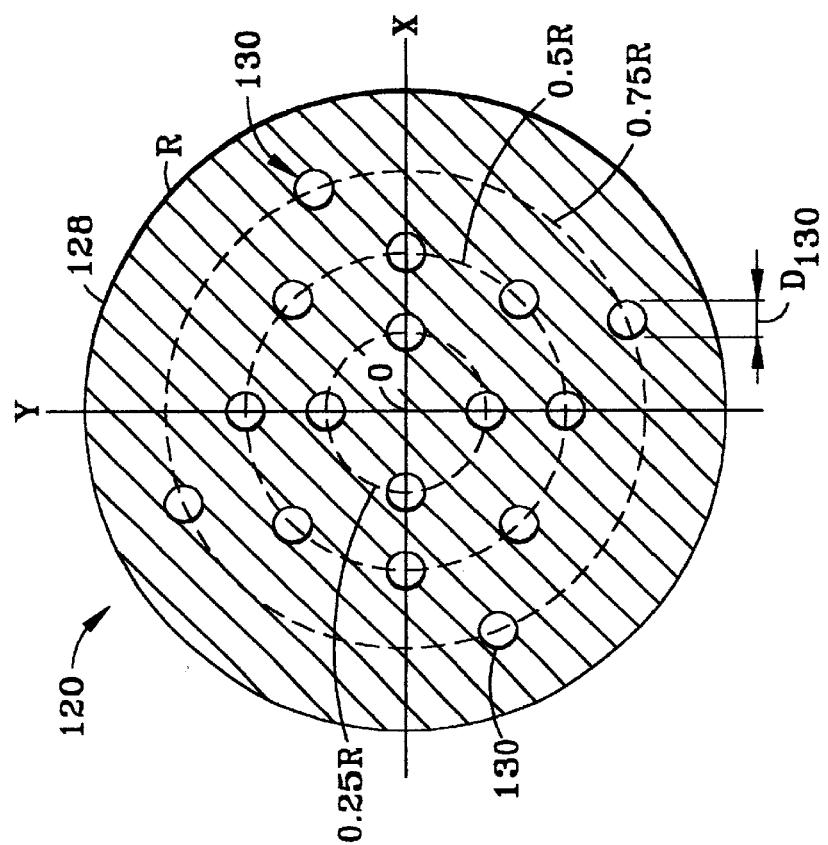
FIG. 3 is a top view of an embodiment of the gas flow restrictor of the present invention having a plurality of uniformly spaced apertures of equal size.
Figure 2:
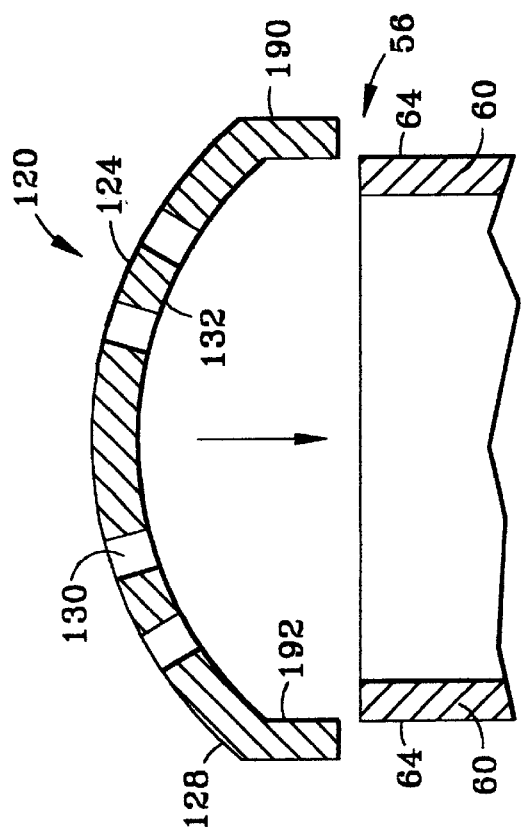
FIG. 2 is a side cross-sectional, enlarged view of the gas flow restrictor of FIG. 1.

With reference now to FIGS. 1–3, an important aspect of the present invention is restrictor 120, discussed briefly above. The purpose of restrictor 120 is to control the pressure within liner tube 50 so as to uniformize the flow velocity of the gas throughout interior 68. This, in turn, has a positive influence on the rate and uniformity with which a film is deposited on each surface 116 of wafers 114. Without restrictor 120, the gas flow velocity at first end 54 differs substantially from the gas flow velocity at second end 56, which, as discussed above, adversely affects the thin film uniformity and rate of deposition. Restrictor 120 accomplishes its gas velocity control function by creating resistance to the flow of gas emerging from liner tube 50 at second end 56 such that back-pressure is created. This back-pressure causes the velocity of the gas at second end 56 to be substantially the same as the velocity of the gas flowing into first end 56 of the liner tube.

Restrictor 120 is preferably curved, such as shown in FIGS. 1 and 2. Because the flow of gas through end 56 is not radially uniform, with the gas flow near the center (i.e., along axis 66) being faster than that near inner wall 62, the curved shape compensates this flow characteristic and improves the uniformity of the gas velocity within interior 68 of liner tube 50. Further, since material is also deposited on underside 132 of restrictor plate 124 during wafer processing, the curved shape also serves to cause this material to deposit uniformly on the underside of the plate. This tends to prevent the material adhering thereto from redepositing onto surfaces 116 of wafers 114. A flat plate 124 may also be employed, though there is a tendency for deposits to build up on such a plate in a non-uniform manner.

With continuing reference to FIG. 2, restrictor 120 preferably further includes an outer lip 190 depending downwardly from underside 132 at outer edge 128. Outer lip 190 further includes an inner surface 192. In a preferred embodiment, the diameter of outer lip 190 is sized such that inner surface 192 closely engages outer surface 64 of liner tube 50 when restrictor 120 is placed over second end 56 of the liner tube. Thus, restrictor 120 serves as a removable cap for liner tube 50. In an alternate embodiment, restrictor 120 is integral with wall 60 of liner tube 50.

A key aspect of the design of restrictor 120 is the size and placement of apertures 130. Apertures 130 are designed to ensure that the velocity of the gas exiting second end 56 of liner tube 50 is substantially the same as the velocity of the gas entering first end 54 of the liner tube. This is achieved, in a preferred embodiment, by designing apertures 130 such that their collective area corresponds to cross-sectional area $A_E$ of gas exhaust pipe 166. Where there is a plurality of gas exhaust pipes 166, the collective area of apertures 130 corresponds to the collective cross-sectional area of each gas exhaust pipe. In a preferred embodiment, apertures 130 are uniformly distributed over plate 124.

For example, for an apparatus 10 having a circular cross-section gas exhaust pipe 166 with a diameter $D_E$=10.16 cm, it follows that cross-sectional area $A_E=\pi(10.16/2)^2=81.03$ cm$^2$. Thus, with reference to FIG. 3, apertures 130 may each be, for example, circular in shape with a diameter $D_{130}$=2.54 cm. This corresponds to an area $A_{130}$ for each aperture 130 of $A_{130}=\pi(2.54/2)^2=5.065$ cm$^2$. Thus, the number of apertures 130 in restrictor 120 for the present example is preferably $A_E/A_{130}$=(81.03 cm$^2$)/(5.065 cm$^2$)=16.

For a liner tube having a radius R, the 16 apertures 130 may, for example, be arranged over plate 124, centered at the following positions given in polar coordinates, with the origin O at the geometric center of the plate and the angle given in degrees: (0.25R, 180), (0.5R, 180), (0.25R, 0), (0.5R, 0), (0.75R, 22.5), (0.5R, 45), (0.5R, 270), (0.25R, 270), (0.25R, 90), (0.5R, 90), (0.5R, 225), (0.75R, 202.5), (0.5R, 135), (0.75R, 112.5), (0.75R, 292.5), and (0.5R, 315).

While the present invention has been described in connection with various embodiments, it will be understood that it is not limited to those embodiments. On the contrary, it is intended to cover all alternatives, modifications and equivalents as may be included within the spirit and scope of the invention as defined in the appended claims.

What is claimed is:

1. An apparatus for depositing a thin film on a surface of a plurality of substrates, comprising:

a) a liner tube having a first end, a second end and an interior capable of accommodating the substrates between said first and second ends;

b) a gas supply system for providing a reactive gas to said interior at or near said first end;

c) a gas exhaust system to exhaust said gas emerging from said second end, said exhaust system including an exhaust conduit located downstream from said second end, said exhaust conduit having a longitudinal axis and a cross-sectional area transverse to said longitudinal axis; and d) a gas flow restrictor arranged at said second end for controlling the flow of said gas between said first and said second ends, wherein said restrictor has a plurality of apertures distributed over said restrictor that extend through said restrictor, said plurality of apertures providing a collective flow area through said restrictor that is substantially equal to said cross-sectional area of said exhaust conduit.

2. An apparatus according to claim 1, wherein said liner tube includes a wall, and wherein said restrictor is integral with said wall.

3. An apparatus according to claim 1, wherein said liner tube includes a wall, and said restrictor includes an outer edge with a lip downwardly depending therefrom, wherein said lip is sized such that said lip closely engages said wall when said restrictor is placed over said second end.

4. An apparatus according to claim 1, wherein said plurality of apertures is evenly distributed over said restrictor.

5. An apparatus according to claim 1, wherein said gas supply system includes a flow controller which provides a measured flow of gas into said interior such that substantially all control of gas flow after said flow controller occurs at said inner tube second end.

6. An apparatus according to claim 1, further including:

a) a chamber surrounding said liner tube and having first and second ends and a chamber wall;

b) a connector wall between said liner tube and said chamber wall, which forms (i) a first chamber defined by said connector wall, said chamber wall, said chamber second end and said liner tube, and (ii) a second chamber defined by said connector wall, said chamber wall and said chamber first end; and c) wherein said gas exhaust system is in pneumatic communication with said first chamber and said gas supply system is in pneumatic communication with said second chamber.

7. An apparatus according to claim 1, wherein said exhaust system comprises a plurality of exhaust conduits, each exhaust conduit having a longitudinal axis and a cross-sectional area transverse to said longitudinal axis, the collective area of said plurality of apertures being substantially equal to the sum of the individual cross-sectional areas of said exhaust conduits.

8. An apparatus according to claim 1, wherein said restrictor is arranged between the substrates and said gas exhaust system.

9. An apparatus according to claim 1, wherein the substrates are semiconductor wafers.

10. An apparatus according to claim 1, wherein said liner tube constitutes a CVD furnace.

11. An apparatus according to claim 10, wherein said liner tube is vertically arranged.

12. An apparatus according to claim 10, wherein said liner tube is horizontally arranged.

13. An apparatus according to claim 1, wherein the pressure within said liner tube ranges from 100 mT to 100 T.

14. An apparatus according to claim 1, further including a holder designed to hold a plurality of substrates with said interior.

15. An apparatus according to claim 14, wherein the substrates are held substantially perpendicular to the longitudinal axis of said liner tube.

16. An apparatus according to claim 1, wherein said first and second ends are at opposing ends of said liner tube.

17. An apparatus according to claim 1, wherein said liner tube second end is closed off solely by said gas flow restrictor.

18. An apparatus for depositing a thin film on a surface of a plurality of substrates, comprising:
 a) a liner tube having a first end, a second end and an interior capable of accommodating the substrates between said first and second ends;
 b) a gas supply system for providing a reactive gas to said interior at or near said first end, wherein said gas has a first gas velocity at said first end;
 c) a gas exhaust system to exhaust said gas emerging from said second end, wherein said gas has a second gas velocity at said second end;
 d) a gas flow restrictor arranged at said second end for restricting the flow of said gas at said second end, wherein said restrictor has a plurality of apertures distributed over said restrictor that extend through said restrictor for maintaining said second gas velocity to be substantially the same as said first gas velocity.

19. An apparatus as claimed in claim 18, further including a stationary wafer support located within said liner tube, said wafer support for supporting the substrates in a fixed position relative to said liner tube during deposition of the thin film.

20. In an apparatus capable of forming a film on a substrate and having a liner tube with a gas inflow end with an associated first gas velocity and a gas outflow end with an associated second gas velocity and a gas exhaust system downstream of said gas overflow end with an associated exhaust cross-sectional area, a gas flow restrictor comprising:
 a) a plate sized so as to substantially cover the gas outflow end;
 b) a plurality of apertures extending through said plate, said apertures having a collective flow area substantially equal to the exhaust cross-sectional area; and
 c) wherein said plate is configured and said apertures are positioned so as to cause said first gas velocity to be substantially the same as said second gas velocity.

21. A restrictor according to claim 20, wherein the restrictor is circular in shape and has a concentric center, said apertures being distributed throughout said plate and having a higher concentration proximal said concentric center than away from said concentric center.

22. A restrictor according to claim 20, wherein said plate is curved.

23. A restrictor according to claim 20, wherein said plate includes an outer edge with a lip downwardly depending therefrom, wherein said lip is sized to closely fit over the gas outflow end of the liner tube.

24. A method of depositing a thin film on the surface of each of a plurality of substrates in a LPCVD apparatus having a liner tube with a first end, a second end and an interior capable of accommodating the plurality of substrates between the first and second ends, and an exhaust cross-section, the method comprising the steps of:
 a) flowing a reactive gas into the liner tube through the first end at a first velocity; and
 b) restricting the flow of said gas only at said second end so as to make the flow of gas at said second end have a second velocity that is substantially the same as said first velocity.

25. A method according to claim 24, wherein said step b) of restricting the flow of gas includes the step of adding a gas flow restrictor at said second end.

26. A method according to claim 25, wherein said step of adding said gas flow restrictor includes the step of providing a restrictor plate.

27. A method according to claim 26, wherein the step of providing said restrictor plate includes the step of providing said restrictor plate with a plurality of apertures having a collective area substantially equal to said exhaust cross-section.

28. A method according to claim 27, further including the step of providing said restrictor plate with a curved surface.

* * * * *

UNITED STATES PATENT AND TRADEMARK OFFICE
CERTIFICATE OF CORRECTION

PATENT NO. : 6,194,030 B1
DATED : February 27, 2001
INVENTOR(S) : Psaute

It is certified that error appears in the above-identified patent and that said Letters Patent is hereby corrected as shown below:

<u>Column 7,</u>
Lines 12-14, claim 17 should be replaced with the following:
17. An apparatus according to claim 3, further comprising an enclosure surrounding said liner tube, said enclosure having a sidewall and an end wall, said sidewall spaced laterally from said liner tube and having a first end extending beyond said second end of said liner tube, said end wall removably engaging said first end of said sidewall such that said enclosure is openable.

Signed and Sealed this

Twenty-seventh Day of July, 2004

JON W. DUDAS
*Acting Director of the United States Patent and Trademark Office*